(12) United States Patent
Sakaguchi

(10) Patent No.: US 10,571,941 B2
(45) Date of Patent: Feb. 25, 2020

(54) VOLTAGE REGULATOR

(71) Applicant: ABLIC Inc., Chiba-shi (JP)

(72) Inventor: Kaoru Sakaguchi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/272,700

(22) Filed: Feb. 11, 2019

(65) Prior Publication Data

US 2019/0286180 A1 Sep. 19, 2019

(30) Foreign Application Priority Data

Mar. 15, 2018 (JP) .................. 2018-047825

(51) Int. Cl.
*G05F 1/571* (2006.01)
*G05F 1/575* (2006.01)
*H03F 3/45* (2006.01)

(52) U.S. Cl.
CPC .............. *G05F 1/571* (2013.01); *G05F 1/575* (2013.01); *H03F 3/45* (2013.01)

(58) Field of Classification Search
CPC . G05F 1/56; G05F 1/562; G05F 1/563; G05F 1/565; G05F 1/573; G05F 1/5735; G05F 1/575; G05F 1/571; G05F 1/569; G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; H02M 5/2573; H02M 5/293; H02M 1/081; H02M 7/12; H02M 2003/1566; H02M 2003/1557; H02M 3/10; H02M 3/125; H02M 3/13; H02M 3/135; H02M 3/145; H02M 3/15; H02M 3/155; H02M 3/156; H02M 3/158; H02M 3/1588; H02M 3/1582; H05B 39/048; B23K 11/24; H04B 2215/069

See application file for complete search history.

(56) References Cited

U.S. PATENT DOCUMENTS

| 6,452,766 B1* | 9/2002 | Carper | G05F 1/573 323/277 |
| 7,502,719 B2* | 3/2009 | Moraveji | G05F 1/575 702/185 |

(Continued)

FOREIGN PATENT DOCUMENTS

JP 2015-7903 A 1/2015

*Primary Examiner* — Adolf D Berhane
*Assistant Examiner* — Nusrat Quddus
(74) *Attorney, Agent, or Firm* — Brinks Gilson & Lione

(57) ABSTRACT

A voltage regulator includes an error amplifier which receives a feedback voltage and a reference voltage and thereby controls a gate voltage of an output transistor, a non-regulation detection circuit having a differential amplifier circuit operating on a current corresponding to an output current of the output transistor, and an overshoot suppression circuit having an overshoot detection circuit which enables an overshoot detection by a signal indicating the detection of non-regulation state from the non-regulation detection circuit.

11 Claims, 2 Drawing Sheets

(56) References Cited

U.S. PATENT DOCUMENTS

| | | | |
|---|---|---|---|
| 7,723,968 B2* | 5/2010 | Okuyama | G05F 1/575 |
| | | | 323/274 |
| 9,377,801 B2* | 6/2016 | Fiocchi | G05F 1/575 |
| 9,893,618 B2* | 2/2018 | Ballarin | H02M 1/08 |
| 2004/0008079 A1* | 1/2004 | Osamura | G05F 1/575 |
| | | | 327/540 |
| 2007/0018623 A1* | 1/2007 | Lopata | G05F 1/575 |
| | | | 323/282 |
| 2007/0194768 A1* | 8/2007 | Bansal | G05F 1/573 |
| | | | 323/277 |
| 2008/0100272 A1* | 5/2008 | Yoshio | G05F 1/56 |
| | | | 323/266 |
| 2012/0098513 A1* | 4/2012 | Terada | G05F 1/575 |
| | | | 323/284 |
| 2012/0153921 A1* | 6/2012 | Brokaw | H02M 3/156 |
| | | | 323/288 |
| 2013/0002220 A1* | 1/2013 | Terada | G05F 1/56 |
| | | | 323/282 |
| 2014/0266122 A1* | 9/2014 | Zhu | H02M 3/156 |
| | | | 323/284 |
| 2016/0105113 A1 | 4/2016 | Tsuzaki et al. | |
| 2016/0161961 A1* | 6/2016 | El-Nozahi | G05F 1/56 |
| | | | 323/280 |
| 2017/0070149 A1* | 3/2017 | Guan | G05F 1/46 |

* cited by examiner

VOLTAGE REGULATOR

RELATED APPLICATIONS

This application claims priority under 35 U.S.C. § 119 to Japanese Patent Application No. 2018-047825 filed on Mar. 15, 2018, the entire content of which is hereby incorporated by reference.

BACKGROUND OF THE INVENTION

1. Field of the Invention

The present invention relates to a voltage regulator.

2. Description of the Related Art

A voltage regulator includes an overshoot suppression circuit which suppresses an overshoot of an output voltage thereof. The overshoot of the output voltage is liable to occur when the output voltage of the voltage regulator is lower than a prescribed output voltage, i.e., in a non-regulation state.

The overshoot suppression circuit has thus a non-regulation detection circuit constructed from a comparator and suppresses the overshoot when the non-regulation detection circuit detects the non-regulation state (refer to, for example, Japanese Patent Application Laid-Open No. 2015-7903).

SUMMARY OF THE INVENTION

Since the comparator of the non-regulation detection circuit is, however, always supplied with current, it is difficult for the voltage regulator in Japanese Patent Application Laid-Open No. 2015-7903 to steadily reduce current consumption.

The present invention aims to provide a voltage regulator having an overshoot suppression circuit of low current consumption.

A voltage regulator according to one aspect of the present invention includes an error amplifier which receives a feedback voltage and a reference voltage and thereby controls a gate voltage of an output transistor, a non-regulation detection circuit having a differential amplifier circuit operating on a current corresponding to an output current of the output transistor, and an overshoot suppression circuit having an overshoot detection circuit which enables an overshoot detection by a signal indicating the detection of non-regulation state from the non-regulation detection circuit.

According to the voltage regulator of the present invention, since the differential amplifier circuit of the non-regulation detection circuit is constituted in such a manner that almost no tail current flows in a regulation state, it is possible to reduce current consumption in the regulation state.

DETAILED DESCRIPTION OF THE PREFERRED EMBODIMENTS

Embodiments of the present invention will hereinafter be described with reference to the accompanying drawings.

Figure 1:
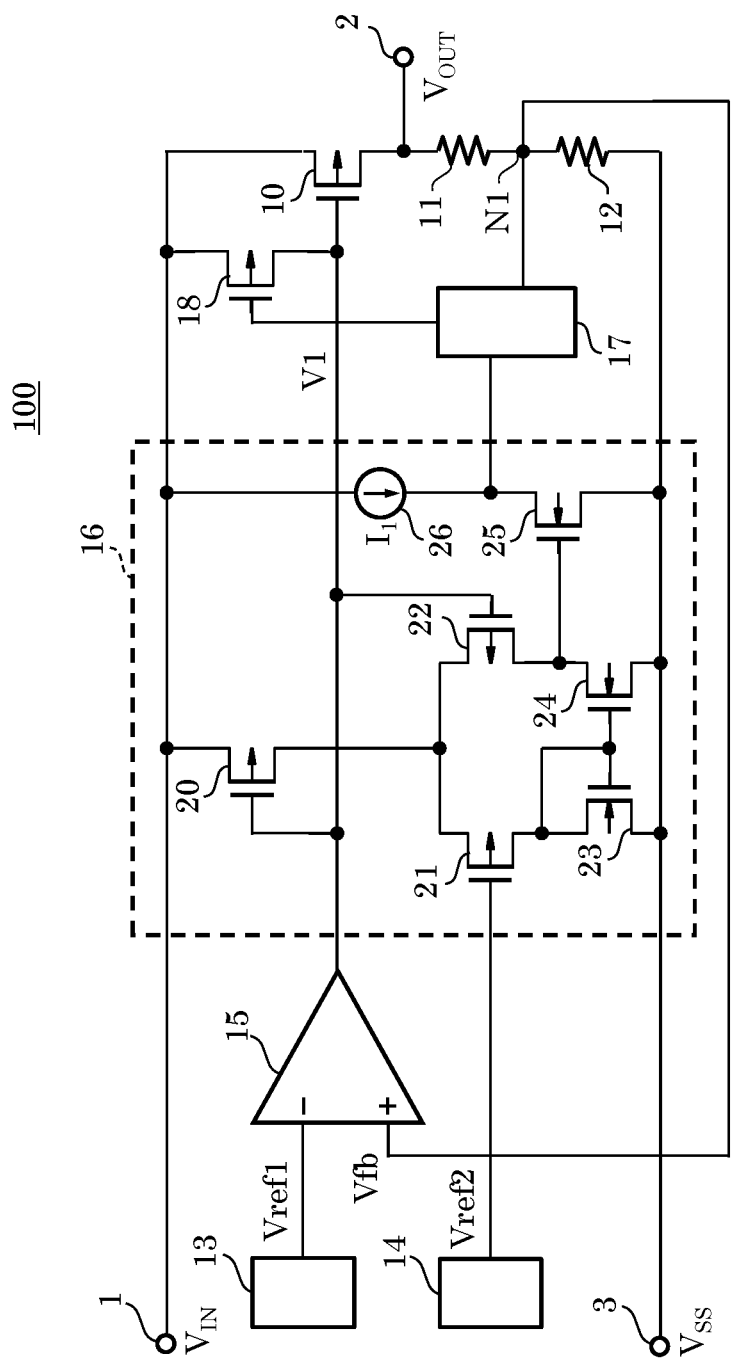
FIG. 1 is a circuit diagram illustrating a voltage regulator according to an embodiment of the present invention.

FIG. 1 is a circuit diagram illustrating a voltage regulator according to an embodiment of the present invention.

The voltage regulator 100 according to the embodiment includes a voltage input terminal 1, a voltage output terminal 2, a ground terminal 3, an output transistor 10, resistors 11 and 12 forming a feedback circuit, reference voltage circuits 13 and 14, an error amplifier 15, a non-regulation detection circuit 16, an overshoot detection circuit 17, and a PMOS transistor 18.

The non-regulation detection circuit 16 includes a differential amplifier circuit and an output inverter. The differential amplifier circuit has a PMOS transistor 20 forming a sense transistor, PMOS transistors 21 and 22 forming a differential pair, and NMOS transistors 23 and 24 forming an active load circuit and constituting a current mirror circuit. The output inverter includes an NMOS transistor 25 and a constant current source 26.

The overshoot detection circuit 17 and the PMOS transistor 18 constitute an overshoot suppression circuit.

A description will be made of connections of the components in the voltage regulator 100.

The output transistor 10 has a source connected to the voltage input terminal 1, a drain connected to the voltage output terminal 2, and a gate connected to an output terminal of the error amplifier 15. The resistors 11 and 12 are connected in series between the voltage output terminal 2 and the ground terminal 3. A connecting point of the resistor 11 and the resistor 12 is defined as a node N1 which provides a feedback voltage Vfb. The error amplifier 15 has a non-inversion input terminal to which the node N1 is connected, and an inversion input terminal to which an output terminal of the reference voltage circuit 13 is connected.

The non-regulation detection circuit 16 has a first input terminal to which an output terminal of the reference voltage circuit 14 is connected, and a second input terminal to which the output terminal of the error amplifier 15 is connected. The overshoot detection circuit 17 has a first input terminal to which an output terminal of the non-regulation detection circuit 16 is connected, a second input terminal to which the node N1 is connected, and an output terminal connected to a gate of the PMOS transistor 18. The PMOS transistor 18 has a source connected to the voltage input terminal 1, and a drain connected to the gate of the output transistor 10.

The PMOS transistor 20 has a source connected to the voltage input terminal 1, a gate connected to the output terminal of the error amplifier 15, and a drain connected to sources of the PMOS transistors 21 and 22. The PMOS transistor 21 has a gate connected to the output terminal of the reference voltage circuit 14, and a drain connected to a gate and drain of the NMOS transistor 23. The PMOS transistor 22 has a gate connected to the output terminal of the error amplifier 15, and a drain connected to a drain of the NMOS transistor 24. The NMOS transistor 23 has a source connected to the ground terminal 3. The NMOS transistor 24 has a gate connected to the gate of the NMOS transistor 23, and a source connected to the ground terminal 3. The NMOS transistor 25 has a drain connected to the voltage input terminal 1 through the constant current source 26, a gate connected to the drain of the PMOS transistor 22, and a source connected to the ground terminal 3.

In the non-regulation detection circuit 16, the drain of the NMOS transistor 25 serves as the output terminal thereof, the gate of the PMOS transistor 21 serves as the first input terminal thereof, and the gate of the PMOS transistor 22 serves as the second input terminal thereof.

The operation of the voltage regulator 100 having such a configuration will be described below.

The reference voltage circuit 13 provides a reference voltage Vref1 based on a voltage Vss of the ground terminal 3. The reference voltage circuit 14 provides a reference voltage Vref2 based on the voltage Vss of the ground terminal 3.

When an input voltage Vin of the voltage input terminal 1 of the voltage regulator 100 is sufficiently high, and the voltage regulator 100 is in a regulation state, an output voltage Vout of the voltage output terminal 2 is controlled to an arbitrarily chosen prescribed output voltage determined by a resistance ratio between the resistors 11 and 12 of the feedback circuit, based on the reference voltage Vref1. At this time, the error amplifier 15 controls a gate voltage of the output transistor 10 to a voltage V1 in such a manner that the feedback voltage Vfb and the reference voltage Vref1 coincide with each other. In the regulation state, the voltage V1 becomes a voltage lowered by a gate-source voltage of the output transistor 10 from the input voltage Vin. The reference voltage Vref2 is set to a voltage lower than the voltage V1. Thus, in the regulation state, the non-regulation detection circuit 16 provides a signal of an H level which indicates the regulation state. When the signal of the non-regulation detection circuit 16 is at the H level, the overshoot detection circuit 17 controls a gate voltage of the PMOS transistor 18 in such a manner that the PMOS transistor 18 is turned off regardless of the feedback voltage Vfb.

The PMOS transistor 20 provides a current proportional to an output current of the output transistor 10 to the differential pair of the differential amplifier circuit as a tail current. The PMOS transistor 20 is designed to be sufficiently smaller in size than the output transistor 10.

When the output current is low in the regulation state, the tail current hardly flows through the PMOS transistor 20 as described above because the tail current becomes almost zero. When the tail current does not flow, the PMOS transistors 21 and 22, and the NMOS transistors 23, 24, and 25 are turned off. When the NMOS transistor 25 is turned off, the signal of the non-regulation detection circuit 16 is fixed to the H level by the constant current source 26. Thus, since the currents through the PMOS transistor 20 and the NMOS transistor 25 become almost zero when the output current is low, current hardly flows through the non-regulation detection circuit 16.

On the other hand, when the input voltage Vin falls below the prescribed output voltage for the output voltage Vout, the voltage regulator 100 becomes a non-regulation state. At this time, since the feedback voltage Vfb is lower than the reference voltage Vref1, the error amplifier 15 pulls down the gate voltage V1 of the output transistor 10 to around 0V. Since the PMOS transistor 20 turns on when the voltage V1 reaches around 0V, the tail current flows so that the respective transistors in the non-regulation detection circuit 16 are biased.

Further, since the voltage V1 is lower than the reference voltage Vref2, the tail current flows to the PMOS transistor 22 of the differential pair and hence a gate voltage of the NMOS transistor 25 becomes high, so that the NMOS transistor 25 turns on. The non-regulation detection circuit 16, thus, provides a signal of an L level which indicates the non-regulation state.

When the overshoot detection circuit 17 receives the signal of the L level from the non-regulation detection circuit 16, the overshoot detection circuit 17 enables overshoot detection of the output voltage Vout. The overshoot detection circuit 17 detects the overshoot of the output voltage Vout caused by variation in the input voltage Vin from a rise in the feedback voltage Vfb. When the overshoot detection circuit 17 detects the overshoot, the overshoot detection circuit 17 provides a signal to turn on the PMOS transistor 18 to raise the on resistance of the output transistor 10, thereby suppressing the overshoot of the output voltage Vout.

As described above, since in the voltage regulator 100 the operating current of the differential amplifier circuit in the non-regulation detection circuit 16 changes corresponding to the output current, current consumption becomes low in the regulation state. And the sufficient operating current to detect non-regulation flows in the non-regulation state, it is possible to suppress the overshoot of the output voltage.

Further, since the output circuit is constructed from the NMOS transistor 25 and the constant current source 26 in the non-regulation detection circuit 16 with no current flowing in the output circuit in the regulation state, current consumption can be reduced.

A modification of the voltage regulator according to the embodiment will next be described.

Figure 2:
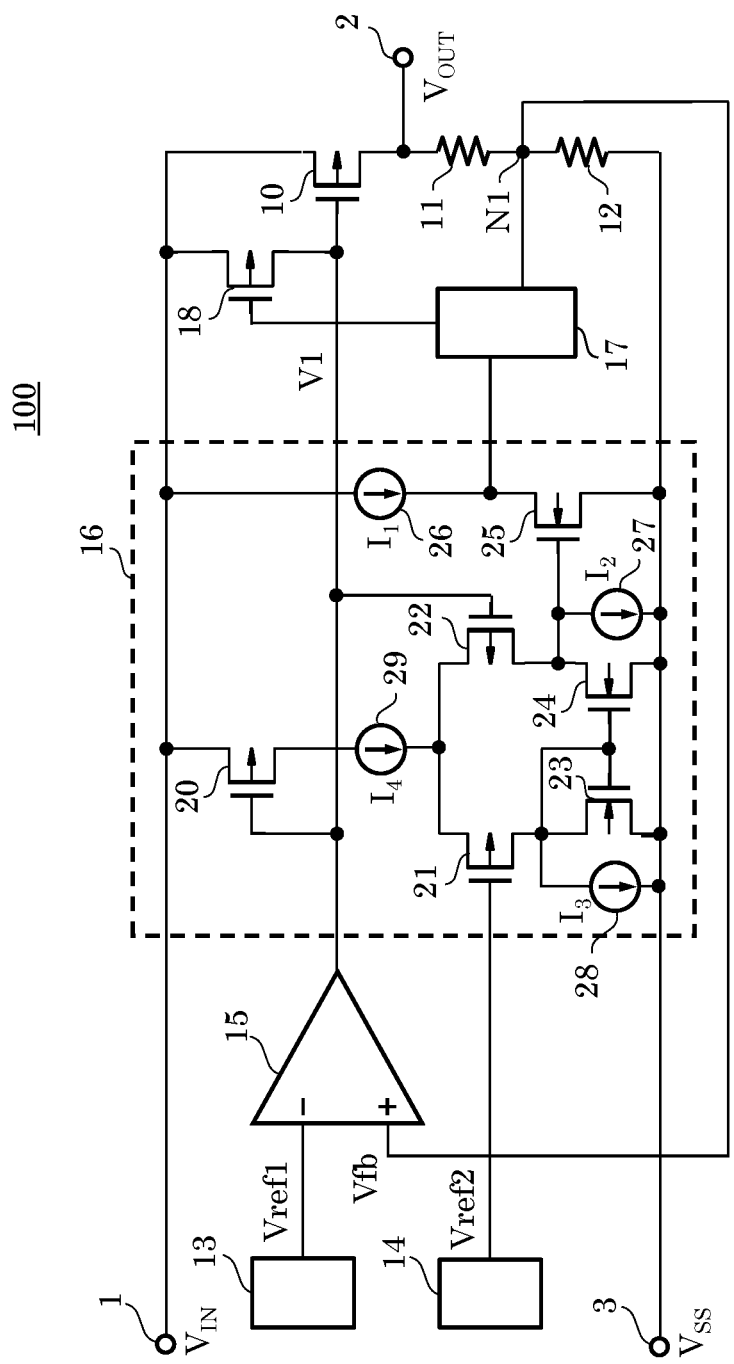
FIG. 2 is a circuit diagram illustrating another example of the voltage regulator according to the embodiment of the present invention.

FIG. 2 is a circuit diagram illustrating another example of the voltage regulator according to the embodiment.

The voltage regulator 100 illustrated in FIG. 2 includes a non-regulation detection circuit 16 having constant current sources 27 through 29. Incidentally, the same components as those in the voltage regulator 100 illustrated in FIG. 1 are denoted by the same reference numerals, and their dual description will be omitted as appropriate.

The constant current source 27 is connected between the gate of an NMOS transistor 25 and the ground terminal 3.

Since the voltage regulator 100 illustrated in FIG. 2 pulls down the gate of the NMOS transistor 25 by the constant current source 27, the output of the non-regulation detection circuit 16 can reliably be brought into an H level even when the output current is very low in the regulation state, and the output of the differential amplifier circuit may become unstable.

Thus, since the constant current source 27 is provided in the voltage regulator 100 in FIG. 2, the output from the non-regulation detection circuit 16 in the regulation state can be more stable.

The constant current source 28 is connected between the drain of the NMOS transistor 23 and the ground terminal 3 in parallel with the NMOS transistor 23.

The constant current source 28 connected in parallel with the NMOS transistor 23 is effective in suppressing an input offset voltage of the differential amplifier circuit which is generated by the connection of the constant current source 27 in parallel with the NMOS transistor 24.

The constant current source 29 is connected to a PMOS transistor 20 in series.

Since the gate voltage V1 of the output transistor is pulled down to around 0V in the non-regulation state, the gate-source voltage of the PMOS transistor 20 increases and the on resistance decreases. The tail current of the differential amplifier circuit in the non-regulation detection circuit 16 thereby becomes large, and current consumption of the voltage regulator 100 in the non-regulation state increases. Since the constant current source 29 connected in series with the PMOS transistor 20 can limit a tail current flowing through the differential amplifier circuit to a value necessary to detect the non-regulation state, increase in the current consumption can be suppressed.

Although the embodiments of the present invention have been described above, the present invention is not limited to the above embodiments. It is needless to say that various changes can be made thereto within the scope not departing from the gist of the present invention.

For example, an input voltage to a differential pair in the non-regulation detection circuit 16 may be set as another voltage obtained by level-shifting the voltage V1, other than the gate voltage V1 of the output transistor. Also, for example, although an output inverter of the non-regulation detection circuit 16 has the NMOS transistor 25 and a constant current source 26, the output inverter may be constructed from a PMOS transistor and a constant current source if the output logic of an error amplifier circuit is inverse. In that case, the constant current source for fixing the output logic of the non-regulation detection circuit may be connected to pull up the gate of the PMOS transistor.

Further, the reference voltage circuit 14 may be supplied with an operating current by a transistor having a configuration similar to that of the PMOS transistor 20. This enables the voltage regulator 100 to further reduce current consumption in the regulation state.

What is claimed is:

1. A voltage regulator having an overshoot suppression function of an output voltage, comprising:
   a feedback circuit configured to provide a feedback voltage based on an output voltage provided from an output transistor;
   an error amplifier configured to receive the feedback voltage and a reference voltage and thereby control a gate voltage of the output transistor in such a manner that the output voltage coincides with a prescribed output voltage;
   a non-regulation detection circuit having a differential amplifier circuit operating on a current corresponding to an output current of the output transistor and an output inverter connected to an output terminal of the differential amplifier circuit, and configured to detect a non-regulation state of the voltage regulator based on the gate voltage of the output transistor being in a state where a source voltage of the output transistor is lower than the prescribed output voltage; and
   an overshoot suppression circuit having an overshoot detection circuit configured to enable an overshoot detection of the output voltage by a signal indicating the detection of the non-regulation state from the non-regulation detection circuit.

2. The voltage regulator according to claim 1,
   wherein the non-regulation detection circuit comprises a sense transistor whose gate is connected to a gate of the output transistor, and
   wherein the sense transistor provides an operating current of the differential amplifier circuit.

3. The voltage regulator according to claim 1,
   wherein the non-regulation detection circuit has a second constant current source connected to the output terminal of the differential amplifier circuit.

4. The voltage regulator according to claim 1,
   wherein the non-regulation detection circuit has a reference voltage circuit operating on a current corresponding to the output current of the output transistor.

5. The voltage regulator according to claim 2,
   wherein the non-regulation detection circuit has a first constant current source in series with the sense transistor.

6. The voltage regulator according to claim 2,
   wherein the non-regulation detection circuit has a second constant current source connected to the output terminal of the differential amplifier circuit.

7. The voltage regulator according to claim 2,
   wherein the non-regulation detection circuit has a reference voltage circuit operating on a current corresponding to the output current of the output transistor.

8. The voltage regulator according to claim 3,
   wherein the non-regulation detection circuit has a reference voltage circuit operating on a current corresponding to the output current of the output transistor.

9. The voltage regulator according to claim 5,
   wherein the non-regulation detection circuit has a second constant current source connected to the output terminal of the differential amplifier circuit.

10. The voltage regulator according to claim 5,
    wherein the non-regulation detection circuit has a reference voltage circuit operating on a current corresponding to the output current of the output transistor.

11. The voltage regulator according to claim 6,
    wherein the non-regulation detection circuit has a reference voltage circuit operating on a current corresponding to the output current of the output transistor.

* * * * *